United States Patent [19]
Takahashi et al.

[11] Patent Number: 6,154,362
[45] Date of Patent: Nov. 28, 2000

[54] DISPLAY APPARATUS

[75] Inventors: Hitoshi Takahashi, Kanagawa; Toshihisa Kojima, Saitama; Kimizo Igarashi, Kanagawa; Hideaki Nakagawa, Tokyo, all of Japan

[73] Assignee: Sony Corporation, Tokyo, Japan

[21] Appl. No.: 09/059,305

[22] Filed: Apr. 14, 1998

[30] Foreign Application Priority Data

Apr. 18, 1997 [JP] Japan ..................................... 9-102087

[51] Int. Cl.⁷ ..................................................... H05H 7/20
[52] U.S. Cl. ........................................... 361/695; 362/218
[58] Field of Search .............................. 40/547, 606, 902; 257/81, 99; 345/5, 905; 361/687, 690, 694–695, 707, 815, 817; 362/11, 218

[56] References Cited

U.S. PATENT DOCUMENTS

| | | | |
|---|---|---|---|
| 3,054,032 | 11/1962 | Sabins | 361/695 |
| 4,177,502 | 12/1979 | Hiscock | 362/218 |
| 5,119,174 | 6/1992 | Chen | 361/707 |
| 5,993,027 | 11/1999 | Yamamoto et al. | 362/218 |

Primary Examiner—Gregory Thompson
Attorney, Agent, or Firm—Jay H. Maioli

[57] ABSTRACT

A display apparatus provided with display cells wherein LEDs are arranged in dot-like array within a case and molded by a mold portion within the case, and a unit portion accommodating therein a cell substrate on which the display cells are mounted. Further, there are provided ventilation holes formed so as to penetrate the display cells at prescribed positions in a direction from rear to front, a fan which is provided in an upper part of a rear surface of the unit portion can send cooling air into the unit portion and an opening portion formed at a bottom surface of the unit portion, thereby making it possible to discharge the cooling air sent by the fan to outside from the ventilation holes through the opening portion. Further, a penthouse unit is provided in front of the display cells and the cooling air discharged from the ventilation holes is caused to be returned to a side of the LEDs.

8 Claims, 9 Drawing Sheets

HEAT DISCHARGING EXPERIMENT

CASE = ALUMINUM
THERMAL CONDUCTIVITY OF SILICONE RESIN = $4.3 \times 10^{-4}$ [cal/cm·sec·°C]

| air quantity [m³/h] | T0 [°C] | T1 [°C] | T2 [°C] | ΔT1 [°C] | ΔT2 [°C] |
|---|---|---|---|---|---|
| 0 | 24.2 | 46.0 | 45.8 | 21.8 | 21.6 |
| 9.6 | 24.5 | 30.0 | 34.3 | 5.5 | 9.8 |
| 18.5 | 24.5 | 27.0 | 30.7 | 2.5 | 6.2 |
| 32.9 | 24.5 | 25.5 | 28.8 | 1.0 | 4.3 |

DISPLAY APPARATUS

BACKGROUND OF THE INVENTION

1. Field of the Invention

The present invention relates to a display apparatus having ventilation means capable of cooling the heat generated by causing a luminous element to emit light.

2. Description of the Related Art

Recently, display apparatus using, for example, a cathode ray tube (CRT), an electrical discharge tube or a light-emitting diode element (hereinafter referred to as "LED") is known. Display apparatus using, for example, LEDs is used as large screen display apparatus for the wall of building or outdoor advertisement.

By the way, it is considered that the light-transforming coefficient of, for example, a CRT or electrical discharge tube is, for example, about 10% and that of an LED is, for example, not much exceeding several percent, so that it follows that a majority of the energy is transformed into heat. Since by this heat a change in physical properties such as, for example, a light-emitting property is accelerated, in order to maintain initial performance and ensure reliability for a long period of time, it is desirable to lower the temperature by using some cooling means. Therefore, means for efficiently carrying out cooling have been considered.

For example, as means for cooling the LED, it is a usual method to discharge heat generated by various kinds of circuit elements mounted on an LED mounting substrate to the outside with the aid of thermal conduction of lead terminals of LEDs. Accordingly, effective discharge of heat can be achieved by making the lead terminal thick so as to increase heat discharging surface area.

However, when a display apparatus is installed outdoors, in order to adopt a waterproof structure for preventing water such as rain from entering the LED mounting substrate, it is necessary to mold, for example, lead terminal portions with waterproof resin or the like. When this structure is adopted, since the heat discharging effect of the lead terminals is reduced, it follows that there is no way other than to cool the LED mounting substrate itself. However, when the mounting substrate is cooled, heat at a rear portion of a display unit on which the mounting substrate is arranged has to be discharged to outside. That is, at a rear side of the display apparatus, since it is necessary to provide, for example, a cooling air conditioner, remove heat from the mounting substrate with the cooling air thereof and discharge heated air to outside of the display unit, a structure of the rear portion of the display unit becomes complicated as a result of obtaining this ventilation passage or the like. In particular, when cooling is carried out using a cooling device such as a cooler, etc., since a large cooling device is required for a large display apparatus, there is such a problem that it is difficult to obtain installation space and the cost becomes high.

SUMMARY OF THE INVENTION

A display apparatus of the present invention comprises ventilation holes penetrating from a front surface to a rear surface of a display panel portion provided in such a manner that light-emitting diodes for display are molded therein and ventilation means for sending air from a rear surface side to a front surface side of the display panel portion through the ventilation holes.

Further, in this display apparatus, there is provided a unit portion, which is formed as a member separate from the display panel portion and in which a substrate electrically connected at least with the display panel portion is accommodated within a box-like member, in such a manner that between it and a rear surface side of the display panel portion there is formed a desired space, and the ventilation means is constituted so as to send air to the rear surface side of the display panel portion through an inside of the unit portion.

According to the present invention, since it is possible to send air from a rear surface to a front surface side of the display panel through the ventilation holes, heat generated around the luminous elements due to their light emission can be absorbed by air and discharged to the outside.

In the present invention, since ventilation holes penetrating from a rear surface to a front surface of a mounting surface of the luminous elements are provided. Cooling air taken in by the ventilation means and flowing through an inside of the unit portion can be discharged to the front of the mounting surface through the ventilation holes. By this, it becomes possible to evenly discharge heat generated at the lead terminals of the luminous elements to outside. Further, by means of returning the cooling air discharged from the ventilation holes by air direction changing means, it is possible to impinge the cooling air onto a front surface side of the luminous elements. Therefore, a reliability of the luminous elements can be improved for a long period of time by carrying out the sufficient heat discharge.

Further, since an opening portion of the unit portion is formed facing downwards, for example even when rain or the like enters it cannot enter into the unit portion, so that the substrate can be protected. Further, since the ventilation means in the present invention suffices if it is caused so as to at least send air, it can be constituted for example by using a plurality of small ones, so that it can be constituted with a lower cost than when a large cooling device is used.

In this manner, the present invention is able to effectively carry out cooling and simultaneously maintain a waterproofness.

DETAILED DESCRIPTION OF THE PREFERRED EMBODIMENTS

Hereinafter, embodiments of display apparatus according to the present invention are explained.

Figure 1:
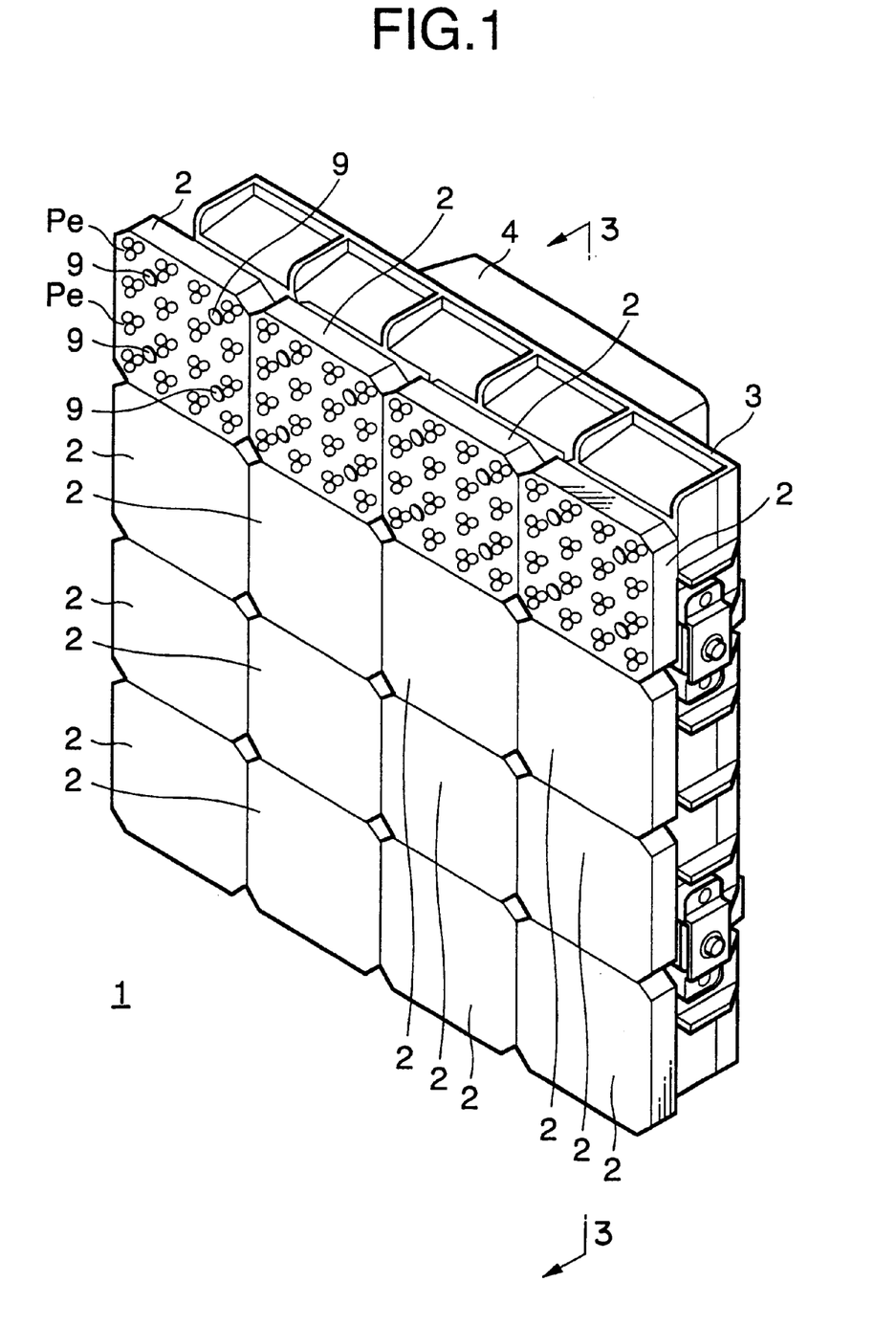
FIG. 1 is a view showing an external appearance of a display unit constituting a display apparatus, according to an embodiment of the present invention.

First, in accordance with a perspective view of FIG. 1, it is explained about an external appearance of a display unit used in a display apparatus according to the embodiment of the present invention.

As shown in the drawing, in a display unit 1 a display screen is formed by display cells 2, 2, 2, ... (with only the uppermost stage shown in detail in FIG. 1) forming display portions arranged, for example, in four at every vertical and horizontal row. In the display cell 2, there are pixels Pe each of which is formed by three LEDs corresponding to each of the colors R, G and B and arranged in a delta array, thereby constituting the display portions in a display apparatus not shown in the drawings. Further, in the present invention, at prescribed positions in the display cell 2 there are formed ventilation holes 9, 9, 9, 9 which penetrate from front to rear of the display cells 2 and through which cooling air is discharged.

The display cells 2 are mounted at a front surface side of a box-like unit portion 3. A cell substrate for mounting the display cells 2 is arranged within the unit portion 3 as described in detail later. Further, cooling means (not shown in FIG. 1) for feeding cooling air into the unit portion 3 is provided in an upper part of a rear surface side of the unit portion 3. A connector portion 4 is formed as connecting means when the display unit 1 is attached to a display apparatus.

Incidentally, when the display portions of the display apparatus are formed, it follows that a plurality of display units 1 are arranged horizontally and vertically in accordance with the resolution of this display apparatus. Further, although in this embodiment it is explained by exemplifying an example wherein the display portions are formed by using a plurality of display units 1, the present invention can be applied also when constituting an integral display portion.

Figure 2A:
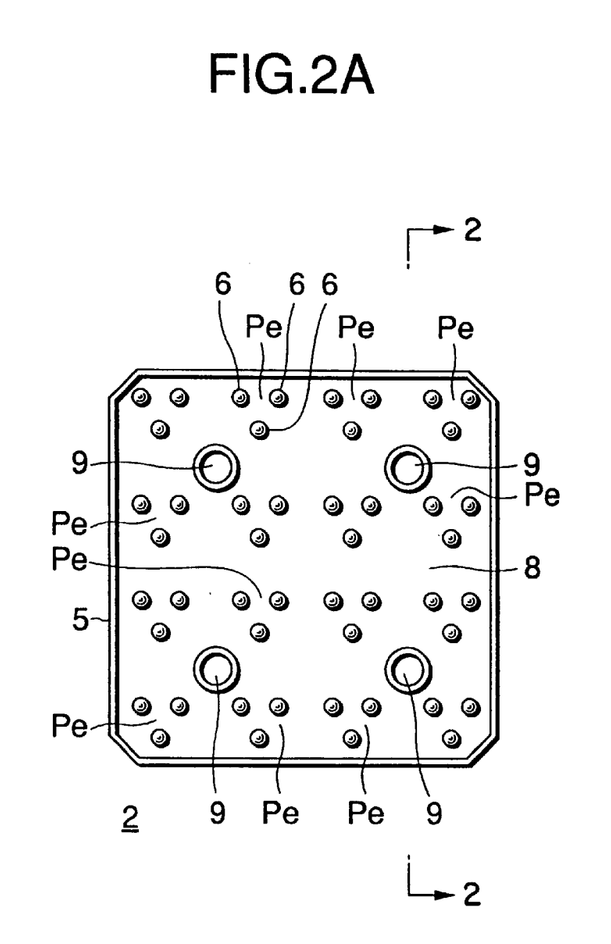
FIG. 2A is a front view explaining a structure of a display cell constituting the display unit according to the embodiment of the present invention.
Figure 2B:
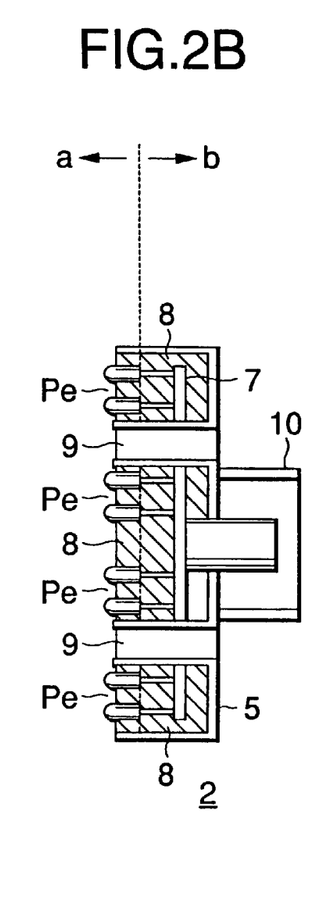
FIG. 2B is a cross-sectional view along 2—2 shown in FIG. 2A.

In explaining the structure of the display cells 2, FIG. 2A is a front view and FIG. 2B is a cross-sectional view taken along section line 2—2 shown in FIG. 2A. Incidentally, in the cross-sectional view of FIG. 2B, although it follows that LEDs are not shown on the line 2—2, they are explained by showing them schematically at the same time in this drawing.

An outer box portion of the display cell 2 is made into a cell case 5 constituted by, for example, a metal such as copper or aluminum having a high thermal conductivity, or a plastic, etc. Pixels Pe, Pe, Pe, ... , each of which is constituted by three LEDs 6, 6, 6 corresponding to each of the colors R, G and B, are arranged in, for example, a delta array. And these pixels are mounted on a mounting substrate 7 arranged within the cell case 5. Incidentally, it follows that one part of one horizontal scanning line is formed by pixels Pe, Pe, Pe and Pe adjacently arranged in the horizontal direction.

An inside of the cell case 5 is made into a mold portion 8 molded with, for example, a waterproof resin, thereby forming waterproof means for the lead terminals of the LEDs 6 and the mounting substrate 7. And, in the present invention, ventilation holes 9 are provided in such a manner as to penetrate from front to rear of the display cells 2 at positions which become, for example, diagonal lines for the plurality of pixels Pe, Pe, Pe ... and, as described later, it is adapted in such a manner that cooling air fed from a rear surface side of the display unit 1 can flow through the ventilation holes.

Further, a connector portion 10 constituted at a rear surface side of the display cell 2 is adapted, as described later, in such a manner that it can be connected to a cell substrate by mounting the display cell 2 on the front surface of the unit portion 3. Further, when mounting the display cell 2, it is adapted such that a prescribed gap (a ventilation passage mentioned later) can be formed between the display cell 2 and a front surface of the unit portion 3.

Incidentally, as shown for example in FIG. 2B, the mold portion 8 may be constituted, for example, by molding a side of an arrow a from a dashed line with a material having a waterproofness and a side of an arrow b, i.e. a side at which the lead terminals of the LEDs 6 and the mounting substrate 7 exist, with a material having a high thermal conductivity, thereby constituting it as a two-layered structure having in combination a waterproofness and a heat-discharging property.

Figure 3:
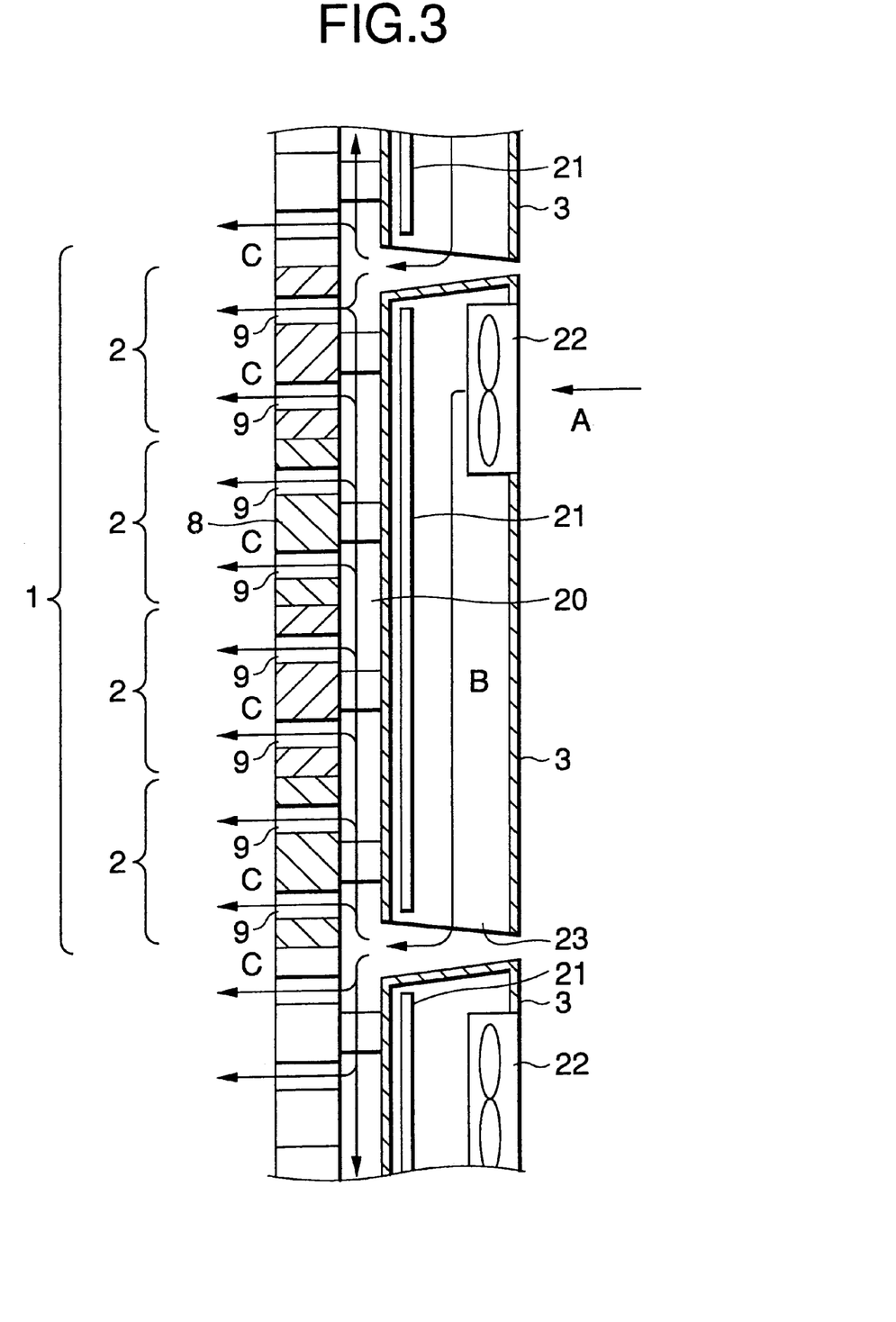
FIG. 3 is a view explaining a structure of the display unit according to the embodiment of the present invention and path of cooling air.

FIG. 3 is a schematic view showing a partial cross-section taken along 3—3 of FIG. 1 and explaining the detailed structure of the display unit 1 and the path of the cooling air. Incidentally, the pixels Pe are not shown in FIG. 3 for convenience's sake.

The unit portion 3 is adapted in such a manner that display cells 2, 2, 2, 2 can be mounted on its front surface side, and a gap formed at this time between the rear surfaces of the display cells 2 and the front surface of the unit 3 is made a ventilation passage 20.

Further, a cell substrate 21 is arranged within the unit portion 3, and it is adapted in such a manner that the connector portion 10 for the mounted display cells 2 can be connected to the unit portion. A picture signal is supplied to this cell substrate 21 via a path not shown in the drawings so as to drive the pixels arranged in the display cells 2.

A small fan 22 such as, for example, that commonly known and used as cooling means in a personal computer device, etc. is provided in an upper part of a rear surface of the unit portion 3 as ventilation means, thereby making it possible to feed external air into the unit portion 3 as cooling air. Further, opening portion 23 is formed at a lower part of the unit portion 3, thereby making it possible to send cooling air flowing within the unit portion 3 to the ventilation passage 20.

That is, paths of the cooling air become in such a manner as shown schematically as thick lines A, B and C. External air is taken into the unit portion 3 as cooling air by the fan 22 as shown for example by the arrow A and, as shown for example by the arrow B after cooling the cell substrate 21 as cooling air, is sent to the ventilation passage 20 from the opening portion 23. Cooling air sent to the ventilation passage 20 is sent to the front of the display cells 2 from the ventilation holes 9 formed in the display cells 2 as shown by the arrows C.

Figure 4:
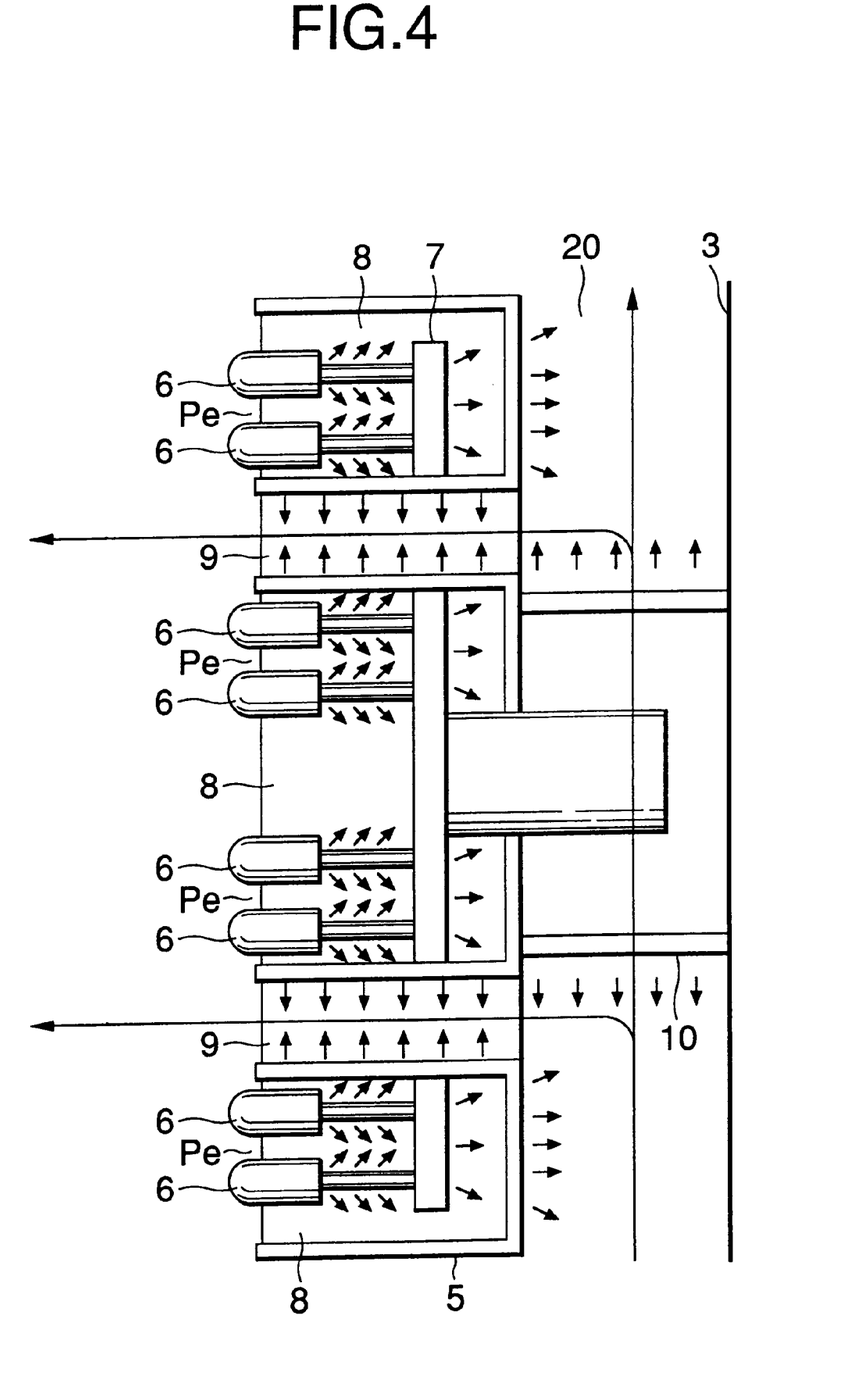
FIG. 4 is a view showing in enlarged scale the display cell shown in FIG. 3 and explaining a summary of heat discharge.

Here, in accordance with FIG. 4 showing the display cells 2 in enlarged scale, it is explained about flows of heat radiated from the display cells 2 and of the cooling air. Incidentally, in FIG. 4, thick line arrows correspond to the flow of cooling air shown in FIG. 3 and fine line arrows schematically show the flow of heat radiated from the lead terminals of the LEDs 6 and the mounting substrate 7.

Heat radiated from the lead terminals of the LEDs 6 and the mounting substrate 7, etc. is transmitted to the mold portion 8 and the cell case 5 and is discharged to outside of the display cells 2 from the surface of the cell case 5, the ventilation holes 9 and the connector portion 10 as shown for example by the fine line arrows. Heat discharged to outside of the display cells 2 is discharged from the ventilation holes 9 to the front of the display cells 2 by the cooling air sent from the opening portion 23 of the unit portion 3 and flowing through the ventilation passage 20.

In this manner, the cooling air taken in from outside by the fan 22 flows within the display unit 1 through such a series of flow path as the unit portion 3→ the ventilation passage 20→the ventilation holes 9 while absorbing heat radiated from the display cells 2, thereby making it possible to cool the inside of the display cells 2 with a high efficiency.

Further, by providing the opening portion 23 in the lower part of the unit portion 3, even when rain or the like enters from, for example, the ventilation holes 9, it follows that the rain will flow downwards along the ventilation passage 20 without being taken into the unit portion 3, so that there is also an advantage that the cell substrate 21 can be protected from moisture.

The fan 22 is provided in the upper part of the rear surface of the unit portion 3 correspondingly to the fact that the opening portion 23 is provided in the lower part of the unit portion 3. By this, cooling air sent in from the fan 22 is caused to prevail within the unit portion 3 from the upper part to the lower part so as to effectively cool the cell substrate 21.

By the way, by means of arranging a so-called penthouse unit on the front surface of the display unit 1, it may be made possible, for example, to improve the contrast of the image and return the cooling air discharged from the ventilation holes 9, 9, 9 . . . to the side of the LEDs 6 so that the LEDs in the display cells 2 can be cooled from the front side.

Figure 5:
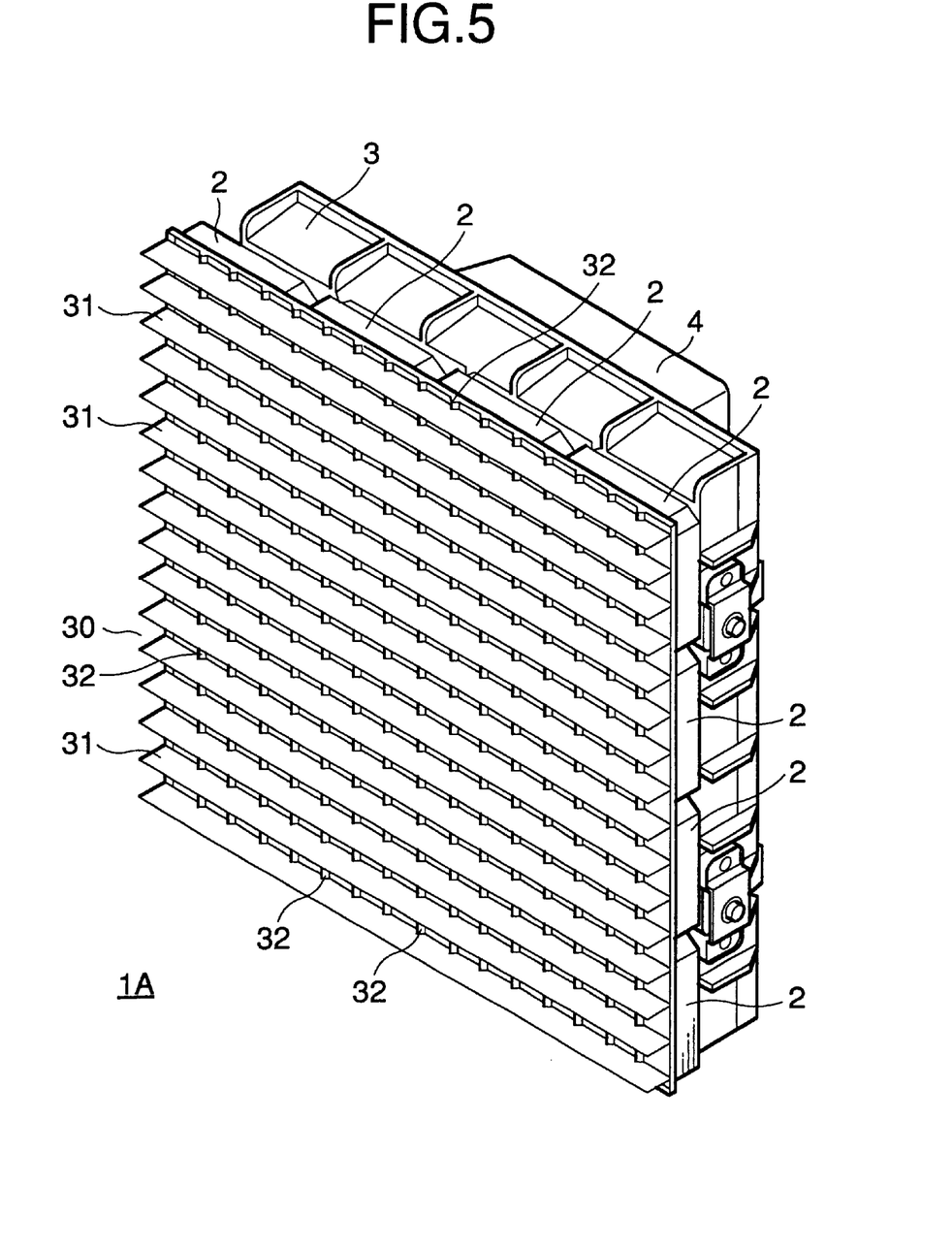
FIG. 5 is an oblique view showing an external appearance of a display unit provided with a penthouse unit at its front surface, which is another embodiment of the present invention.
Figure 6:
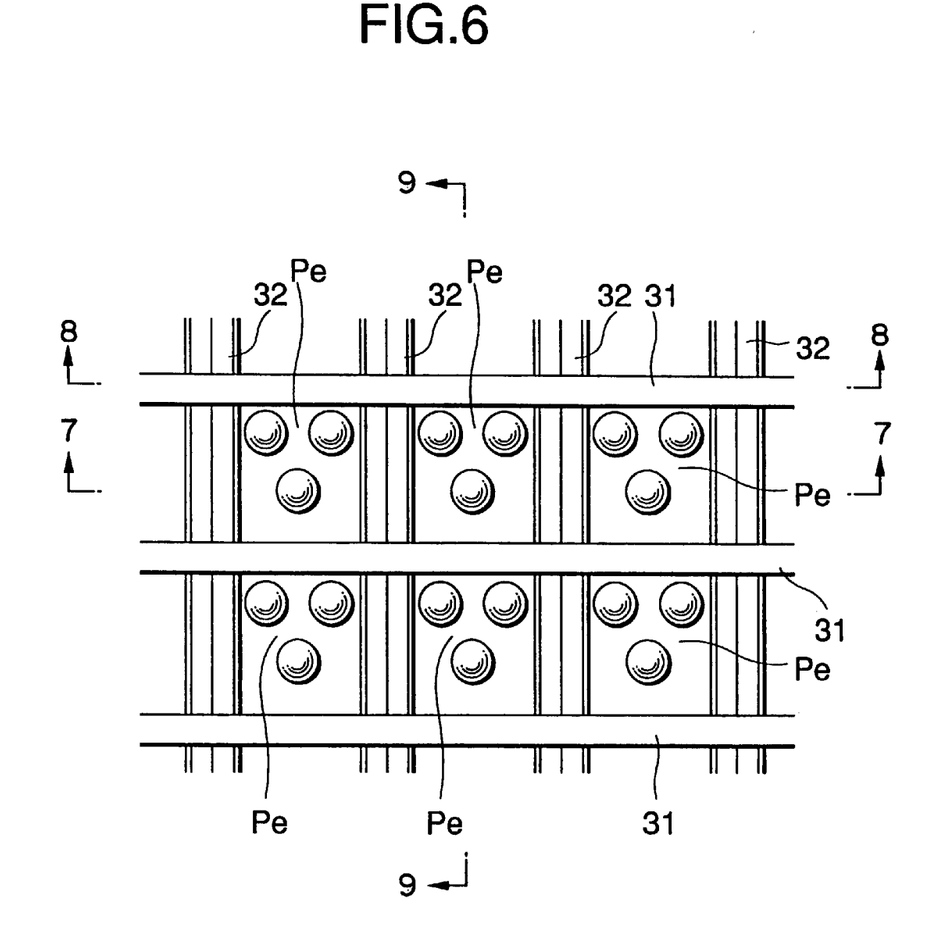
FIG. 6 is a front view showing in enlarged scale a part of the display unit shown in FIG. 5.

FIG. 5 is a perspective view showing a display unit 1A provided with such a penthouse unit, which forms another embodiment of the present invention, and FIG. 6 is an enlarged partial view showing the display unit 1A shown in FIG. 5 from the front. Incidentally, portions which are the same as for the display unit 1 shown in FIG. 1 are given the same numerals and their description is omitted.

A penthouse unit 30 attached to the front surface of the display unit 1A is formed, for example, as an integral body in such a manner that penthouses 31, 31, 31 . . . formed in the horizontal direction and gutter-like ventilation groove portions 32, 32, 32 formed in the vertical direction so as to cross the penthouses 31 in the form of a lattice.

As shown in FIG. 6, the penthouses 31 are arranged with a prescribed angle at neighboring positions in the upper part of the pixels Pe. Incidentally, the penthouses 31 are arranged at an angle set by conditions such as the position of arrangement of the display apparatus. As mentioned later, a front part of the ventilation groove portion 32 is made in a mountain shape and a rear part is made in a valley shape, and the ventilation groove portions 32 are arranged at positions corresponding to the ventilation holes 9 of the display cells 2. And, it is adapted such that the cooling air sent from the ventilation holes 9 can be returned to the side of the LEDs.

Thus, it follows that, when the penthouses 31 and the ventilation groove portions 32 are arranged as described above, the pixels Pe face the front through lattice-like empty portions so that an image can be formed.

Further, an image with an improved contrast can be obtained by making the penthouse unit 30 black, for example.

Next, it is explained in detail about a structure of the ventilation groove portion 32.

Figure 7:
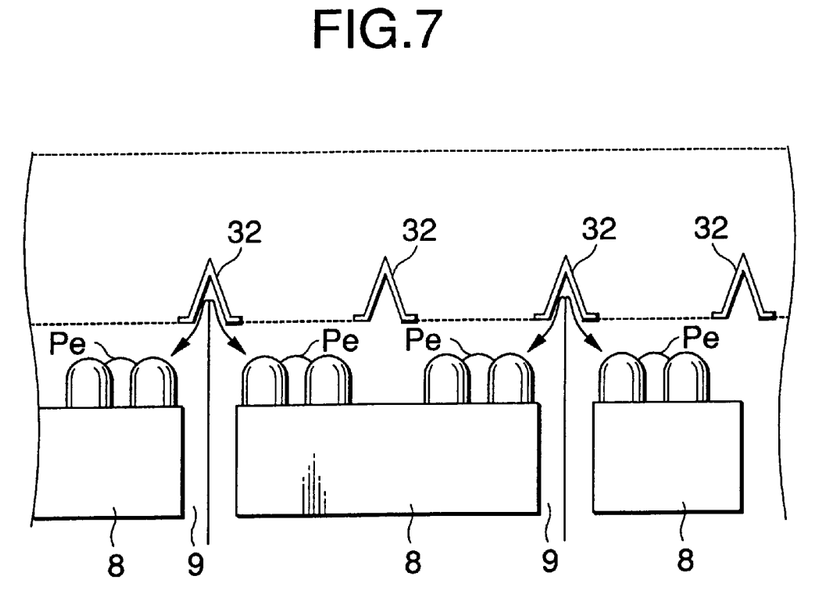
FIG. 7 is a view showing a cross-section along 7—7 shown in FIG. 6.
Figure 8:
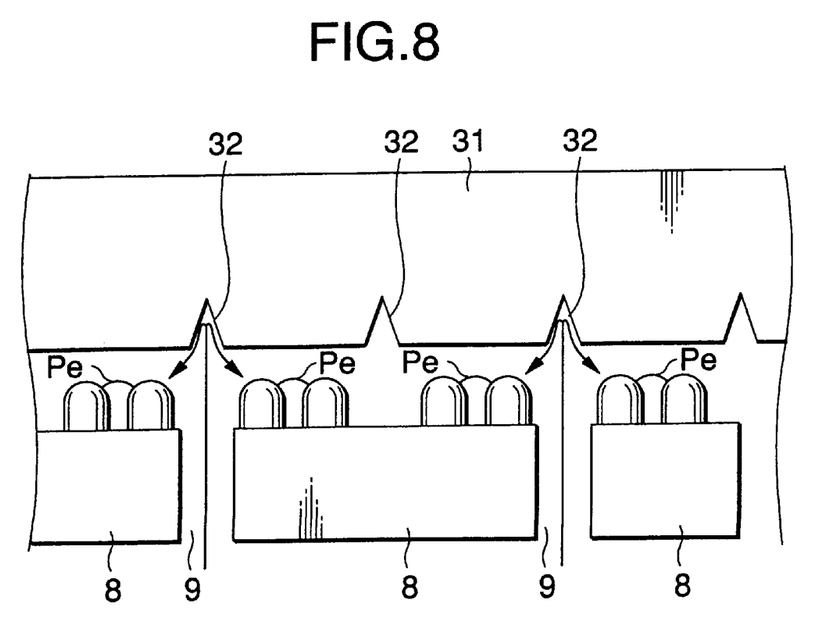
FIG. 8 is a view showing a cross-section along 8—8 shown in FIG. 6.

FIG. 7 is a view showing a cross-section taken in the vicinity of 7—7 shown in FIG. 6, and FIG. 8 is a view showing a cross-section taken in the vicinity of 8—8 in FIG. 6.

As shown in FIG. 7, the ventilation groove portion 32 is arranged in such a manner that its valley side faces the ventilation hole 9. And, as shown by the arrows, it is adapted such that the cooling air sent from the ventilation holes 9 can be returned to the side of the pixels Pe. Further, at the penthouse 31 the ventilation groove portion 32 is constituted, for example, as shown in FIG. 8, as a notch, and it is adapted such that the cooling air sent from the ventilation holes 9 can also be returned to the side of the pixels Pe in the same way as in the case shown in FIG. 7.

Figure 9:
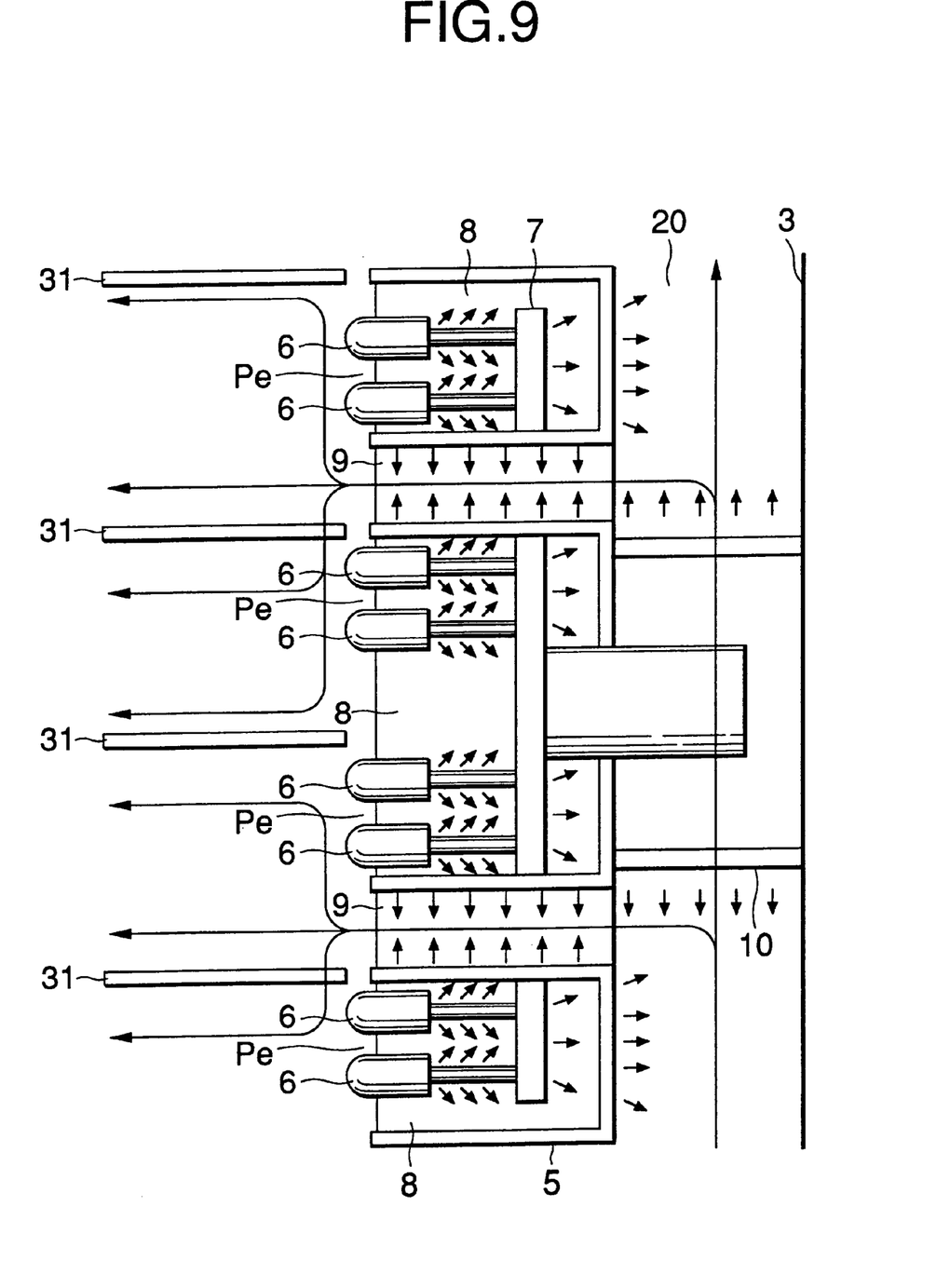
FIG. 9 is a view showing in enlarged scale the display cell and penthouses and explaining a summary of heat discharge.

Further, when the path of the cooling air sent from the ventilation holes 9 is seen from the side, it becomes as shown in FIG. 9 (9—9 is shown in FIG. 6). In this case, it follows that the cooling air sent from the ventilation holes 9 is sent, for example, along the penthouses 31, 31, 31 . . . as shown by the arrows to the front of the display cells 2.

In this manner, by providing the penthouse unit 30, after carrying out cooling by circulation within the unit portion 3 (not shown in FIG. 7 through FIG. 9), the cooling air sent from the ventilation holes 9 can be returned and used again so as to cool the pixels Pe arranged at the front surface of the display cells 2 from the front.

Incidentally, although the present embodiment has been explained by exemplifying an example wherein the ventilation groove portions 32 are provided in the vertical direction, they may be provided in the horizontal direction with a combined use of the penthouses 31, for example. Further, although here the present embodiment has been explained by exemplifying an example wherein the penthouses 31 and the ventilation groove portions 32 are formed as an integral body as the penthouse unit 30, it may be possible to constitute the penthouses 31 and the ventilation groove portions 32 respectively as a separate unit and attach it to the front surface of the display unit 1.

Next, is explained an example of thermal conductivity in the display apparatus to which the present invention has been applied.

Figure 10:
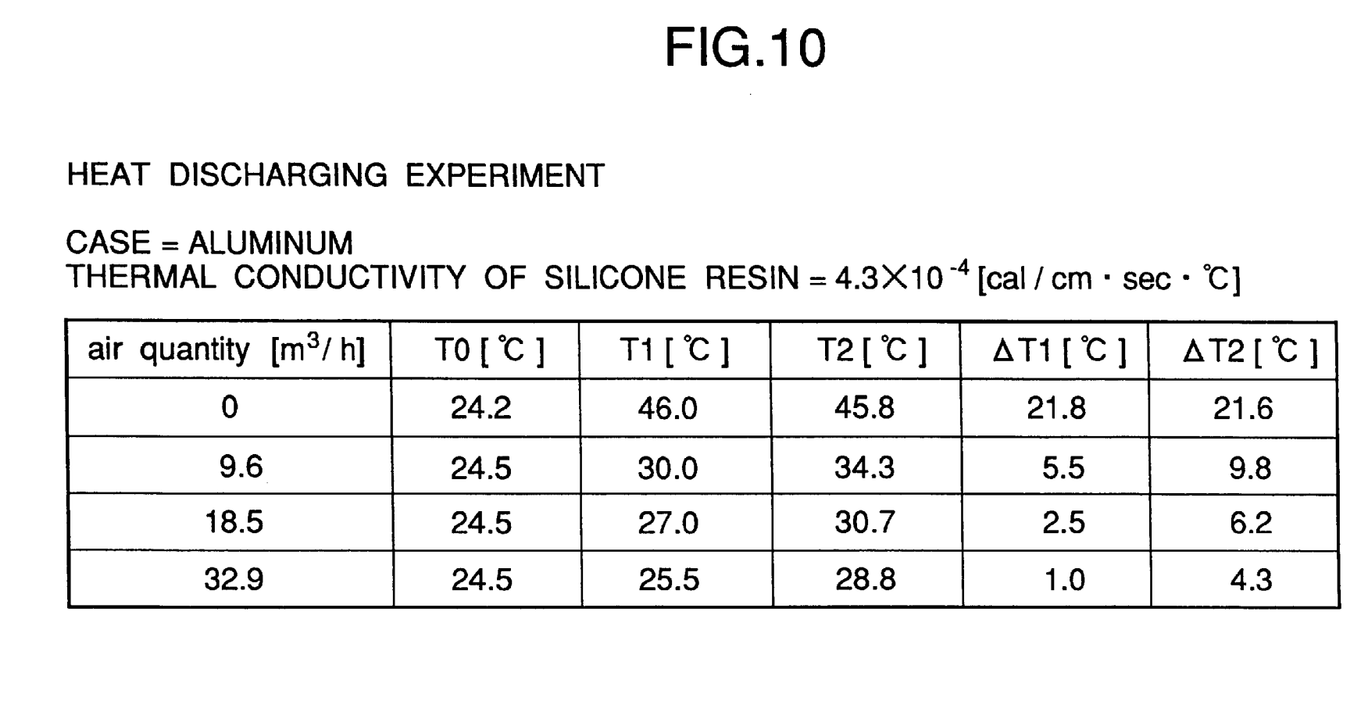
FIG. 10 is a view showing an example of cooling effect versus quantity of cooling air.

FIG. 10 is a view showing an example of cooling effect versus quantity of cooling air sent by the fan 22, wherein a temperature T0 shows the temperature of external air indicated by the arrow A shown in FIG. 3, a temperature T1 shows the temperature of the ventilation passage 20 and a temperature T2 shows the temperature of the mold portion 8.

Incidentally, the numerical values shown in this drawing are shown as an example in the event that the cell case 5 is made of, for example, aluminum and the mold portion 8 is made of silicone resin having a thermal conductivity of $4.3 \times 10^{-4}$ Cal/cm·sec·° C.

When for example the external air temperature is 24.2° C., in the event that the ventilation by the fan 22 is not carried out, i.e. in the event that an air quantity is 0 m$^3$/h, the temperature T1 of the ventilation passage 20 rises to 46.0° C. due to heat generated at the display cells 2, the unit portion 3, etc. and the temperature T2 of the mold portion 8 becomes 45.8° C. Therefore, a temperature difference ΔT1 between the external air and the ventilation passage 20 becomes for example 21.8° C. and a temperature difference ΔT2 between the external air and the mold portion 8 becomes for example 21.6° C.

When the cooling air of for example 9.6 m$^3$/h is fed by the fan 22, the temperature T1 of the ventilation passage 20 can be lowered to 30.0° C. and also the temperature T2 of the mold portion 8 can be lowered to 34.3° C. By this, the temperature difference ΔT1 can be decreased to for example 5.5° C. and the temperature difference ΔT2 can be decreased to 9.8° C. Further, when the cooling air of for example 18.5 m³/h is fed, the temperature difference ΔT1 can be decreased to 2.5° C. and the temperature difference ΔT2 can be decreased to 6.2° C. Still further, when the cooling air of for example 32.9 m³/h is fed, the temperature difference ΔT1 can be decreased to 1.0° C. and the temperate difference ΔT2 can be decreased to 4.3° C.

In this manner, by controlling a quantity of the cooling air fed by the fan 22 it is possible to decrease the difference in temperature between the external air, the mold portion 8 and the ventilation passage 20.

Incidentally, in FIG. 10 although there is shown an example in to which the cell case 5 is constituted of aluminum and the silicone resin is used in the mold portion 8, nearly the same advantages can be obtained also by means of constituting the cell case 5 by for example copper or a plastic, etc. having a comparatively high thermal conductivity and the mold portion 8 by silicone resin of a material having a required thermal conductivity and combining them together.

What is claimed is:

1. A display apparatus comprising:

a display panel (2) having light emitting diodes embedded therein;

ventilation holes (3) penetrating from a front surface to a rear surface of said display panel;

ventilation means (22) for sending air from said rear surface to said front surface of said display panel portion through said ventilation holes; and a box-like unit portion (3) formed separately from and attached to said display panel and having a substrate electrically connected with said display panel accommodated within said box-like unit portion.

2. The display apparatus according to claim 1, wherein said box-like unit portion is spaced apart from said rear surface of said display panel to form a ventilation passage, and said ventilation means sends air to said rear surface of said display panel through an inside of said box-like unit portion to said ventilation passage.

3. The display apparatus according to claim 2, wherein said ventilation means comprises:

a fan for sending external air into the inside of said box-like unit portion, wherein an opening portion is formed in said box-like unit portion so that the inside of said box-like unit portion and the rear surface of said display panel are in communication by the opening portion and the ventilation passage.

4. The display apparatus according to claim 3, wherein said fan is arranged in an upper part of a rear surface of said box-like unit portion.

5. The display apparatus according to claim 3, wherein said display panel has a top portion and a bottom portion relative to said front surface and said rear surface and said opening portion is facing downwards relative to said bottom portion at a lower side of said box-like unit portion.

6. The display apparatus according to claim 1, further comprising air direction changing means provided in front of said ventilation holes for changing a direction of air discharged from said ventilation holes so as to return discharged air to a side at which said light-emitting diodes are exposed from the front surface of said display panel.

7. The display apparatus according to claim 1, wherein said display panel comprises a cell case portion having the light emitting diodes embedded therein and being formed of a material having a high thermal conductivity.

8. The display apparatus according to claim 1, wherein said display panel comprises a cell case portion (5) containing a mold portion (8) in which said light-emitting diodes are embedded, said mold portion being constituted so that a front surface side (8*a*) thereof is formed of a waterproof material having a waterproofness and at least one portion (8*b*) other than said waterproof material is formed of a thermally conductive layer formed by a material having a predetermined thermal conductivity value.

* * * * *